(12) United States Patent
Mahatme et al.

(10) Patent No.: US 9,947,391 B1
(45) Date of Patent: Apr. 17, 2018

(54) SRAM BASED PHYSICALLY UNCLONABLE FUNCTION AND METHOD FOR GENERATING A PUF RESPONSE

(71) Applicant: NXP USA, INC., Austin, TX (US)

(72) Inventors: Nihaar N. Mahatme, Austin, TX (US); Srikanth Jagannathan, Austin, TX (US); Alexander Hoefler, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/486,049

(22) Filed: Apr. 12, 2017

(51) Int. Cl.
  *G11C 11/00* (2006.01)
  *G11C 11/419* (2006.01)
  *G11C 11/418* (2006.01)

(52) U.S. Cl.
  CPC .......... *G11C 11/419* (2013.01); *G11C 11/418* (2013.01)

(58) Field of Classification Search
  CPC .................. G11C 11/419; G11C 11/418
  See application file for complete search history.

(56) References Cited

U.S. PATENT DOCUMENTS

| 8,848,477 B2 | 9/2014 | Schrijen et al. | |
| 2015/0262653 A1* | 9/2015 | Chu | G11C 29/06 365/154 |
| 2017/0062072 A1* | 3/2017 | Ghosh | B82Y 10/00 |
| 2017/0180140 A1* | 6/2017 | Mai | H04L 9/3278 |
| 2017/0345492 A1* | 11/2017 | Yoshimoto | G06F 3/0604 |
| 2017/0365316 A1* | 12/2017 | Wang | G11C 11/161 |

OTHER PUBLICATIONS

Mathias Claes, Vincent van der Leest, and An Braeken, "Comparison of SRAM and FF PUF in 65nm technology, Information Security Technology for Applications" (Peeter Laud, ed.), Lecture Notes in Computer Science, vol. 7161, Springer Berlin / Heidelberg, 2012, pp. 47-64.

Schrijen, Geert-Jan, and Vincent van der Leest. "Compatative analysis of SRAM memories used as PUF primitives." In Proceedings of the Conference on Design, Automation and Test in Europe, pp. 1319-1324. EDA Consortium, 2012.

(Continued)

*Primary Examiner* — Toan Le

(57) ABSTRACT

A physically unclonable function (PUF) is implemented in a plurality of SRAM cells. In a method for generating a PUF response, a logic zero is first written to all the SRAM cells of the PUF. A bit line coupled to the storage node that stores the logic zero of each SRAM cell is biased to a predetermined voltage. The bit lines are then selected for an evaluation read operation. During the evaluation read, a read current of one of the bit lines from one column is converted to a first voltage and a read current of another bit line of another column is converted to a second voltage. The first voltage is then compared to the second voltage. A logic state of a bit of the PUF response is determined as a result of the comparison. The logic bit may be provided to the input of a parallel-in serial-out shift register. There may be a comparator for each logic bit, or a few comparators may be shared between the logic bits. The PUF response may be used to provide a signature for the data processing system. The back-bias of each cell may be selectively adjusted.

20 Claims, 6 Drawing Sheets

(56) References Cited

OTHER PUBLICATIONS

Georgios N. Selimis, Mario Konijnenburg, Maryam Ashouei, Jos Huisken, Harmke de Groot, Vincent van der Leest, Geert Jan Schrijen, Marten van Hulst, and Pim Tuyls, "Evaluation of 90nm 6T-SRAM as physical unclonable function for secure key generation in wireless sensor nodes.", ISCAS, IEEE, 2011, pp. 567-570.
G. Edward Suh and Srinivas Devadas, "Physical unclonable functions for device authentication and secret key generation", Design Automation Conference (New York, NY, USA), ACM Press, 2007, pp. 9-14.
Zhang, Fengchao, Shuo Yang, Jim Plusquellic, and Swarup Bhunia. "Current based PUF exploiting random variations in SRAM cells." In Design, Automation & Test in Europe Conference & Exhibition (DATE), 2016, pp. 277-280. IEEE, 2016.
Hussain, Siam U., Sudha Yellapantula, Mehrdad Majzoobi, and Farinaz Koushanfar. "BIST-PUF: Online, hardware-based evaluation of physically unclonable circuit identifiers." In Proceedings of the 2014 IEEE/ACM International Conference on Computer-Aided Design, pp. 162-169. IEEE Press, 2014.

\* cited by examiner

SRAM BASED PHYSICALLY UNCLONABLE FUNCTION AND METHOD FOR GENERATING A PUF RESPONSE

BACKGROUND

Field

This disclosure relates generally to electronic circuits and more specifically to a static random access memory (SRAM) based physically unclonable function (PUF) and method for generating a PUF response.

Related Art

A physically unclonable function (PUF) is a physical system that will produce an unpredictable response when a stimulus is input. An example PUF uses a static random access memory (SRAM). SRAM cells are bi-stable, meaning they only have two stable states. When powered up, the bi-stable SRAM cell will settle in one of the two stable states. Because a conventional SRAM is normally laid out to be symmetrical, the state it will be in when powered-up is unpredictable. However, manufacturing variations, temperature, power supply, switching noise, device aging, and other factors may cause some of the cells of the PUF to power-up in different states at different times. Because of this randomness, no two integrated circuits are exactly alike and so the output of the PUF is difficult to predict, and therefore difficult to recreate. This makes the PUF useful for storing unique information about the IC. For example, the PUF may be used to generate a digital signature or encryption/decryption key.

However, because of the potential variability in power-up states, it may be necessary to preserve the initial PUF response, or to take steps to ensure the initial PUF response can be recreated. One way to preserve the initial PUF response is by using helper data. The helper data can be used to correct bit errors that result from variability. Also, built-in self-test (BIST) circuits have been used to access the PUF. However, the use of BIST provides a security vulnerability and exposes the IC to attacks.

Therefore, a need exists a way to implement a PUF that provides a more stable value and better resistance to attacks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
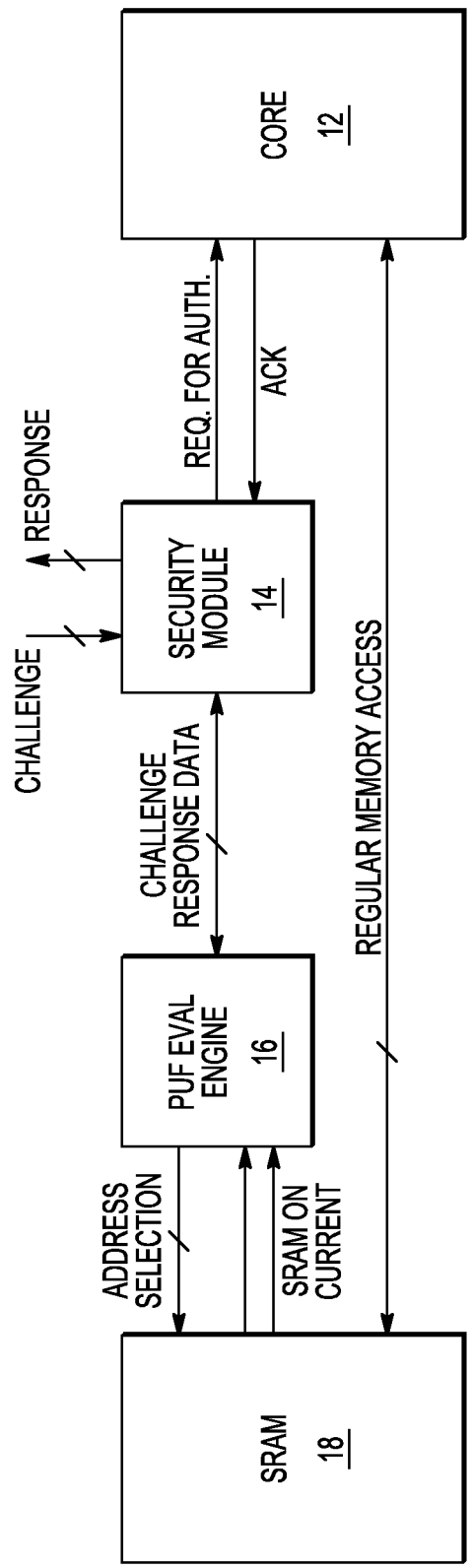
FIG. 1 illustrates a system in accordance with an embodiment.

Generally, there is provided, a PUF implemented in a plurality of SRAM cells in a SRAM array. A method is provided for generating a digital code in a data processing system using the PUF. In the method, a logic zero is first written to all the SRAM cells of the PUF. A bit line coupled to the storage node storing the logic zero of each SRAM cell is biased to a predetermined voltage. The bit lines corresponding to the logic zero storage nodes are then selected for an evaluation read operation. During the evaluation read, a read current of one of the bit lines is converted to a first voltage and a read current of another bit line is converted to a second voltage. The first voltage is then compared to the second voltage. A logic state of a bit of the digital code is determined as a result of the comparison. The logic bit may be provided to the input of a parallel-in serial-out shift register. There may be a comparator for each logic bit, or a few comparators may be shared between the logic bits, or a few bits may share a comparator by way of multiplexing. Two SRAM cells are used to provide one bit of the digital code. The digital code may be used to provide a signature for the data processing system. Using the bit line currents through the conductive N-channel transistors instead of the P-channel transistors of the cells provides higher resilience to aging. Also, a read current through the N-channel transistors is a DC current in the micro-amps range that provides resistance to noise, unlike the start-up behavior of the cell which is sensitive to noise. In addition, the body bias of the transistors of each cell can be varied to increase the relative variation of read currents, thus potentially reducing signature size. In particular, a body bias condition that operates the transistors near or below the threshold voltage will be effective in achieving this increased relative variation of read currents.

Implementing the SRAM PUF in this manner provides a more stable signature that is repeatable, yet also provides high randomness. Therefore, neither helper data nor a BIST is needed. The approach also provides better resistance to aging, immunity to AC noise, and higher reliability.

In one embodiment, there is provided, a method for generating a digital code in a data processing system, the method comprising: selecting a plurality of static random access memory (SRAM) cells for a write operation; writing a predetermined logic state to all the plurality of SRAM cells; biasing only one bit line of each bit line pair of a plurality of bit line pairs corresponding to the plurality of SRAM cells to a predetermined voltage; coupling a bit line of a first SRAM cell of the plurality of SRAM cells to a first input of a comparator; coupling a bit line of a second SRAM cell of the plurality of SRAM cells to a second input of the comparator; generating a current on the bit lines of the first and second SRAM cells; converting the currents on both the bit lines to voltages; using the comparator, comparing the voltage on the bit line of the first SRAM cell to the voltage on the bit line of the second SRAM cell; and outputting a logic bit from the comparator, a logic state of the logic bit determined in response to the comparison. The plurality of SRAM cells may comprise a physically unclonable function (PUF) and the digital code is a PUF response. The method may further comprise: saving the logic state of the logic bit in a parallel-in serial-out shift register; and generating the digital code using the logic state. The method may further comprise receiving a challenge from a security module, wherein the outputting the logic bit occurs in response to the challenge. The first and second SRAM cells may be coupled to geometrically matched bit lines based on symmetrical bit line locations in a layout of bit line pairs of the plurality of bit line pairs. The step of writing a predetermined logic state to all the plurality of SRAM cells may further comprise writing a logic zero to all the plurality of SRAM cells. The method may further comprise selectively adjusting a body bias to at least one of transistor of the plurality of SRAM cells to change a threshold voltage of the at least one of transistor. The method may further comprise deactivating input/output circuitry in the data processing system prior to the step of generating a current of the bit lines. The step of generating the current on the bit lines may further comprise generating the current through an N-channel transistor of each of the first and second SRAM cells.

In another embodiment, there is provided, a method for generating a digital code from a physically unclonable function (PUF) in a data processing system, the method comprising: providing a plurality of SRAM cells to serve as the PUF; selecting the plurality of static random access memory (SRAM) cells for a write operation in response to a challenge; writing a predetermined logic state to all the plurality of SRAM cells; biasing one bit line of each bit line pair of a plurality of bit line pairs corresponding to the plurality of SRAM cells to a predetermined voltage; selecting the plurality of SRAM cells for a PUF read operation; providing a first read current of one bit line of a first SRAM cell and a second read current of one bit line of a second SRAM; converting the first read current to a first voltage and the second read current to a second voltage; comparing the first voltage to the second voltage; and outputting a logic bit in response to the comparison. The step of writing the predetermined logic state may further comprise writing a logic zero to all the plurality of SRAM cells. The method may further comprise providing the logic bit to a parallel-in serial-out shift register. The step of providing a first read current of one bit line of a first SRAM cell and a second read current of one bit line of a second SRAM may further comprise providing the first and second read currents through an N-channel transistor of each of the first and second SRAM cells. The method may further comprise selectively adjusting a body bias to at least one of transistor of the plurality of SRAM cells to change a threshold voltage of the at least one of transistor. The method may further comprise deactivating input/output circuitry in the data processing system prior to the step of providing the first and second read currents.

In yet another embodiment, there is provided, a data processing system comprising: a processor core; an SRAM array coupled to the processor core, the SRAM array having a plurality of SRAM cells, each SRAM cell of the plurality of SRAM cells coupled to a pair of bit lines and to a word line, wherein the plurality of SRAM cells for providing a physically unclonable function (PUF); and a PUF evaluation engine coupled to the plurality of SRAM cells, the PUF evaluation engine comprising: a selection circuit for selecting one or more word lines coupled to the plurality of SRAM cells in response to a challenge; a bias circuit coupled to one bit line of each of the pairs of bit lines corresponding to the plurality of SRAM cells; and at least one comparator coupled to the one bit line of each of the pairs of bit lines, the at least one comparator for comparing voltage differences between two of the bit lines, a voltage on a bit line representing a read current of one SRAM cell, wherein a logic state is output from the comparator in response to the comparison. The data processing system may further comprise a switching circuit for selecting coupling one bit line of a first bit line pair and one bit line of a second bit line pair to the at least one comparator. The data processing system may further comprise a body bias circuit for selectively adjusting a body bias to at least one of the transistors of the plurality of SRAM cells to change a threshold voltage of the at least one of the transistors. The data processing system may further comprise a parallel-in serial-out shift register coupled to an output of the at least one comparator. The plurality of SRAM cells may be coupled to a plurality of bit line pairs, wherein the at least one comparator may further comprise a plurality of comparators, a comparator of the plurality of comparators coupled to a first bit line of a first bit line pair of the plurality of bit line pairs and to a first bit line of a second bit line pair of the plurality of bit line pairs.

FIG. 1 illustrates a data processing system 10 in accordance with an embodiment. Data processing system 10 includes processor core 12, security module 14, PUF evaluation engine 16 and SRAM 18. Processor core 12 can be any kind of processor core for executing instructions. Processor core 12 is bi-directionally connected to SRAM 18 for regular read and write operations. Processor core 12 is also connected to security module 14 to provide an acknowledge signal ACK when a request for authentication (REQ FOR AUTH) is requested by security module 14. Security module 14 provides the request for authentication in response to receiving a challenge signal from a requestor. When response data RESPONSE DATA is needed because a challenge labeled CHALLENGE is received from a requestor, PUF evaluation engine 16 provides an address to SRAM 18. In response, SRAM 18 provides a PUF response back to PUF evaluation engine 16. PUF evaluation engine 16 evaluates the response and generates a digital code. The digital code is used to generate a unique chip ID, encryption/decryption key, digital signature, or the like. Note that only the circuits used to generate the PUF response are illustrated. For the purposes of simplicity and clarity, some or all the circuits used for normal read and write operations of SRAM 18 are omitted.

Figure 2:
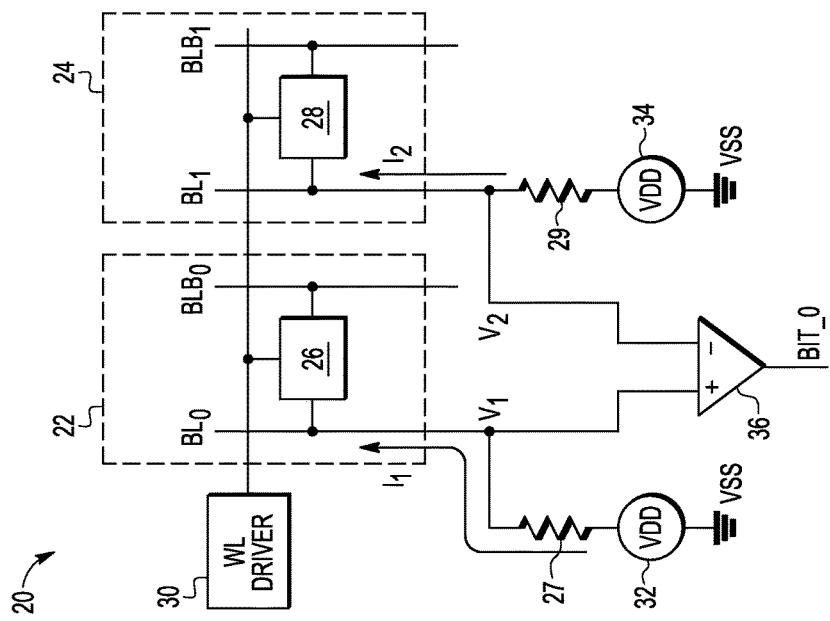
FIG. 2 illustrates a portion of the system in FIG. 1 for outputting a PUF response in accordance with an embodiment.

FIG. 2 illustrates a portion 20 of the data processing system 10 in FIG. 1 for outputting a PUF response in accordance with an embodiment. Portion 20 includes SRAM cell columns 22 and 24, SRAM cells 26 and 28, resistance elements 27 and 29, word line driver 30, voltage sources 32 and 34, and analog comparator 36. SRAM cell columns 22 and 24 are a part of SRAM array 18 in FIG. 1. SRAM array 18 includes a plurality of SRAM cells organized in rows and columns. The plurality of SRAM cells form a PUF that is used to generate a PUF response. In the illustrated embodiment, a column includes a bit line pair and all the SRAM cells connected to the bit line pair. A row includes a word line and all the SRAM cells connected to the word line. The rows and columns intersect so that a memory cell is coupled to a word line and a bit line pair at the intersections. In other embodiments, the memory organization may be different.

In column 22, a bit line pair labeled BL0 and BLB0 intersect with a word line labeled WL. A representative SRAM cell 26 is illustrated connected to word line WL and bit line pair BL0 and BLB0 where they intersect. Many more word lines intersect bit line pair BL0 and BLB0 (not shown). Note that bit line BLB is a logical complement of bit line BL. Likewise, column 24 includes bit line pair BL1 and BLB1 and representative SRAM cell 28 connected to bit line pair BL1 and BLB1 and word line WL. Comparator 36 has a first input connected to bit line BL0 of column 22, a second input connected to bit line BL1, and an output for providing a PUF response labeled BIT_0. The first input of comparator 36 is labeled "+" and the second input is labeled "−". The true bit lines BL from each bit line pair of the PUF are connected to inputs of a comparator so that two SRAM cells are employed to generate one bit of the PUF response. The complementary bit lines BLBs are not used to produce the PUF response. A resistive element 27 has a first terminal connected to bit line BL0 at a node labeled V1, and a second terminal. A voltage source 32 labeled VDD has a first terminal connected to the second terminal of resistive element 27, and a second terminal connected to VSS, or ground. A resistive element 29 has a first terminal connected to bit line BL1 at a node labeled V2, and a second terminal. A voltage source 34 labeled VDD has a first terminal connected to the second terminal of resistive element 29, and a second terminal connected to VSS, or ground. The operation of portion 20 will be discussed below in the discussion of FIG. 4 and FIG. 5.

Figure 3:
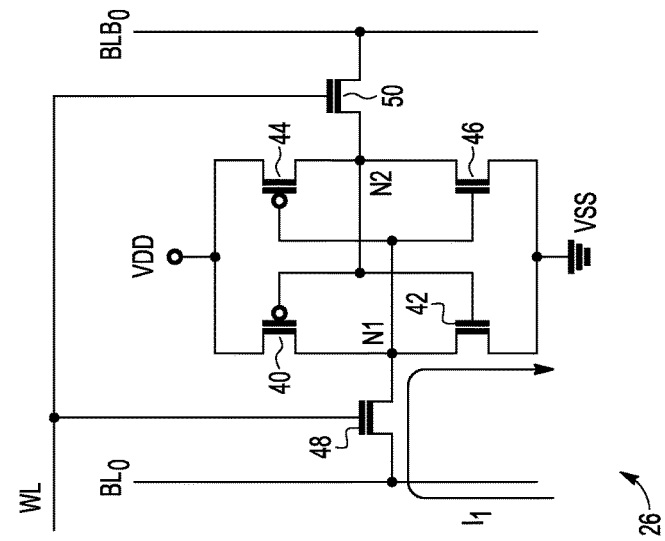
FIG. 3 illustrates an embodiment of an SRAM cell of FIG. 2.

FIG. 3 illustrates an embodiment of SRAM cell 26 of FIG. 2. SRAM cell 26 is a six transistor SRAM cell and includes P-channel transistors 40 and 44, and N-channel transistors 42, 46, 48, and 50. N-channel transistor 42 and P-channel transistor 40 form a first inverter, and N-channel transistor 46 and P-channel transistor 44 for a second inverter. The two inverters are cross-coupled to form two storage nodes labeled N1 and N2. N-channel transistors 48 and 50 are access transistors for coupling the bit lines to storage nodes N1 and N2. In other embodiments, the SRAM cells of SRAM array 18 may be different. The cross-coupled inverters are connected between power supply voltage terminal VDD and ground terminal VSS. The transistors may be implemented using an appropriate conventional complementary metal-oxide semiconductor (CMOS) process.

Figures 4, 5:
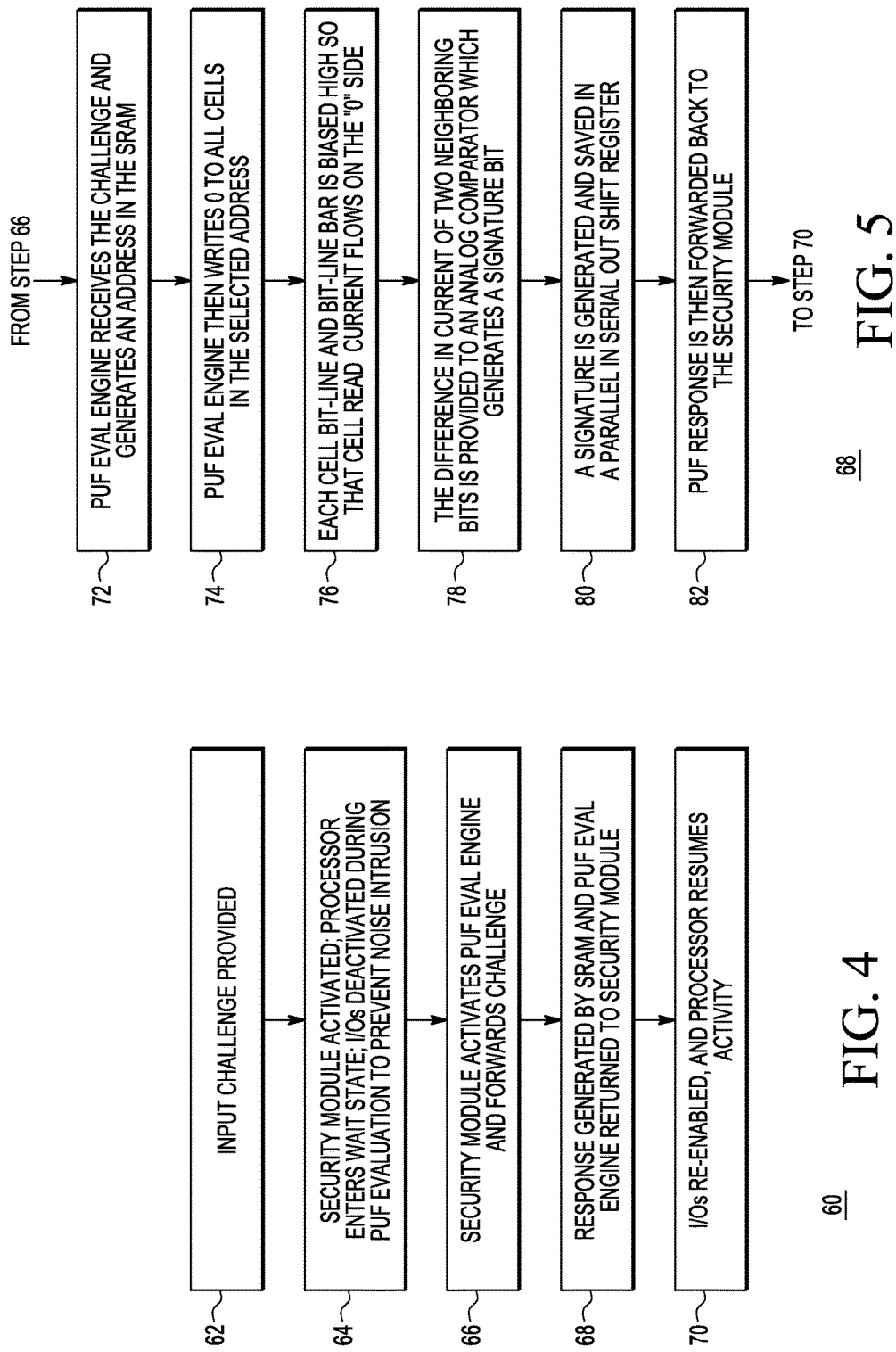
FIG. 4 illustrates a method for generating a PUF response in the system of FIG. 1.
FIG. 5 illustrates more detail of a step in the method of FIG. 4.

FIG. 4 illustrates a method 60 for generating a PUF response in the data processing system of FIG. 1. Referring now to FIGS. 1-4, method 60 begins at step 62. At step 62, an input challenge is provided to security module 14 from a requestor. At step 64, security module 14 is activated if not already active. The processor may enter an inactive state, such as a wait state and input/output (I/O) circuits are deactivated during PUF evaluation to prevent noise caused by the switching of large output transistors from affecting the PUF evaluation. At step 66, security module 14 activates PUF evaluation engine 16 and then forwards the challenge to PUF evaluation engine 16. At step 68, PUF evaluation engine 16 evaluates the SRAM cells that comprise the PUF, and provides a PUF response generated in response to the challenge. At step 70, the I/Os are re-enabled. The PUF response is provided to security module 14, and security module 14 may forward the PUF response to the requestor. Processor core 12 resumes normal processing. Processor core 12 may access SRAM 18 for regular read and write access. Also, processor core 12 may communicate with security module 14 in response to, for example, requests for authentication.

FIG. 5 illustrates more detail of step 68 in method 60 of FIG. 4. The more detailed step 68 begins at step 72. At step 72, PUF evaluation engine 16 receives the challenge and generates an address to access the PUF in SRAM array 18. In the illustrated embodiment, the PUF may include all of SRAM 18 or a portion thereof, depending on how many bits are required for the PUF and the size of SRAM array 18. If only a portion of the array is used, the PUF may use one contiguous area of SRAM array 18 or be distributed over the array. At step 74, the address selects the SRAM cells of the PUF and PUF evaluation engine 16 causes logic zeros to be written into the selected SRAM cells. Referring to FIG. 3, the logic zero is written by biasing the true bit line BL0 with a logic zero and the complementary bit line BLB0 with a logic one. Access N-channel transistors 48 and 50 are conductive because word line WL is a logic high causing storage node N1 to be low and storage node N2 to be high. The high storage node N1 causes the gate of transistors 40 and 42 to be high so that P-channel transistor 40 is off, or non-conductive, and N-channel transistor 42 is on, or conductive. The low voltage at storage node N1 causes N-channel transistor 46 to be non-conductive. At step 76, as biased, a read current labeled i1 flows through N-channel transistors 48 and 50 from voltage source 32 and resistive element 27. The resistive element functions to convert the current to a voltage that can be readily compared. The voltage drop across resistive element 27 is labeled V1. A similar current flows through all the other true bit lines and SRAM cells being used to produce the PUF response. For example, in FIG. 2, a current labeled i2 flows from voltage source 34 through resistive element 29 and through SRAM cell 28 similar to the current i1 through SRAM cell 26 in FIG. 3. At step 78, the currents i1 and i2 from neighboring SRAM cells 26 and 28 produces voltages V1 and V2, respectively, which are provided to the plus and minus inputs of comparator 36. In one embodiment, currents i1 and i2 are from adjacent bit lines. In another embodiment, the currents may be from bit lines that are matched based on symmetrical bit line locations in a layout of SRAM array 18. Generally, using matched bit lines provides reduced capacitive offset between the two bit lines, depending on the SRAM array layout Comparator 36 is an analog comparator that compares V1 to V2 and provides an output bit BIT_0 having a logic state determined by which of voltages V1 and V2 is highest. For example, if V1 is higher than V2, the output bit BIT_0 may be a logic one. In this manner, all the bits of the PUF response are generated. At step 80, a signature may be generated from the PUF response that uniquely identifies the integrated circuit device having the SRAM array. At step 82, the PUF response may be provided to security module 14. Security module 14 may then forward the PUF response to the requestor of the challenge.

Using the bit line currents through the conductive N-channel transistors of the cells provides higher resilience to aging compared to the P-channel transistors of the cells. Also, a read current through the N-channel transistors is a DC current in the micro-amps range that provides resistance to noise, unlike the start-up behavior of the cell which is sensitive to noise. However, in another embodiment, the currents may be provided through the P-channel transistors of the SRAM cells.

Figure 6:
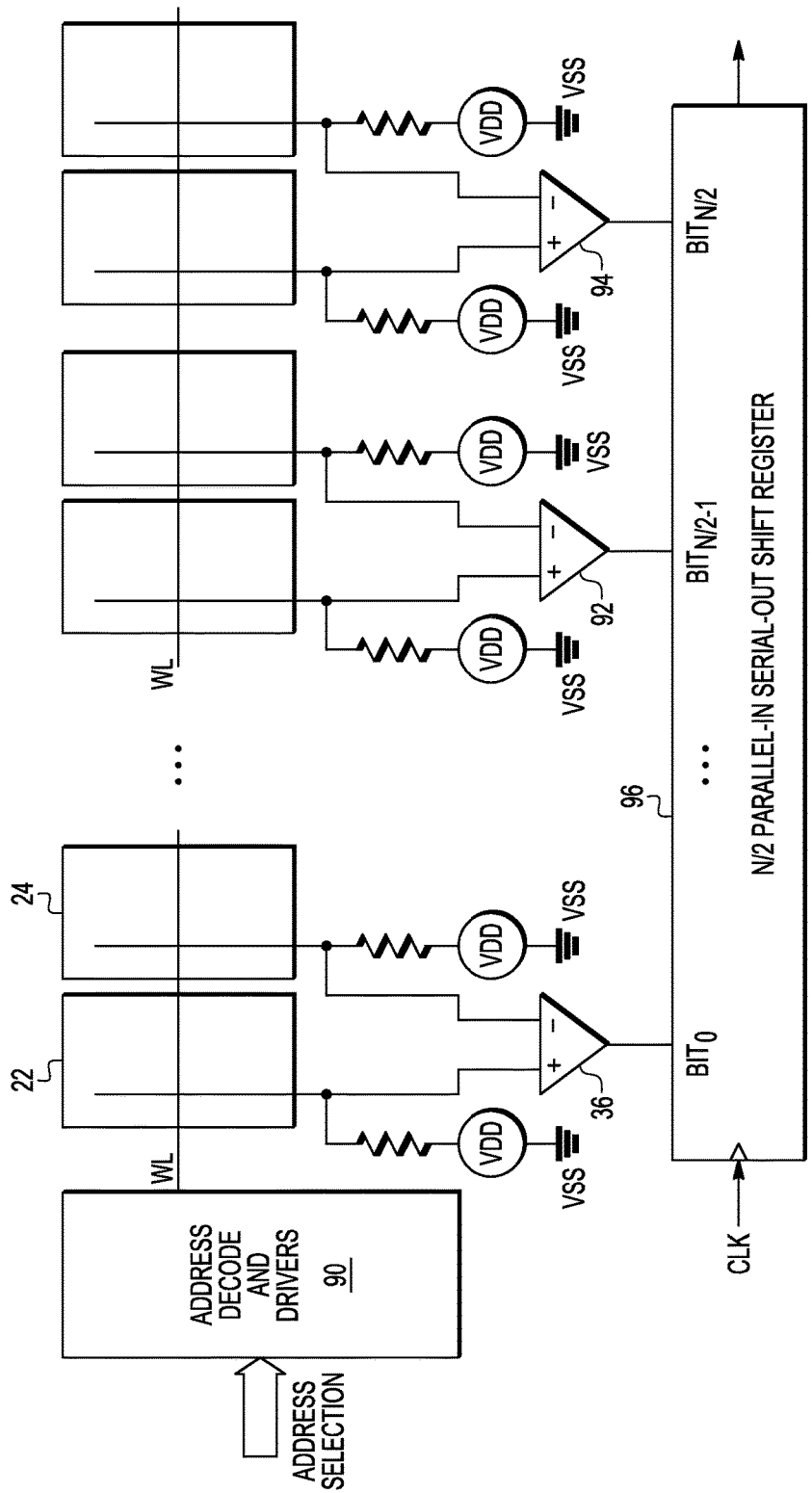
FIG. 6 illustrates a portion of the system of FIG. 1 for outputting a PUF response in accordance with an embodiment.

FIG. 6 illustrates a portion of the data processing system of FIG. 1 and FIG. 2 for outputting a PUF response in accordance with an embodiment. In FIG. 6, a comparator is provided for each pair of columns used to generate the PUF response. Only the true bit line of each column is provided for comparison, the complementary bit line of each column is not connected. An N/2 bit parallel-in serial-out shift register is connected to the outputs of each comparator, such as comparators 36, 92, and 94, to receive the results of the comparison of step 78 in FIG. 5, where N is the number of columns being used. Twice as many columns are used as bits in the PUF response, thus requiring N/2 comparators in the illustrated embodiment. An address decoder and WL drivers 90 is illustrated receiving an address labeled ADDRESS SELECTION. A word line WL is selected by the received address.

Figure 7:
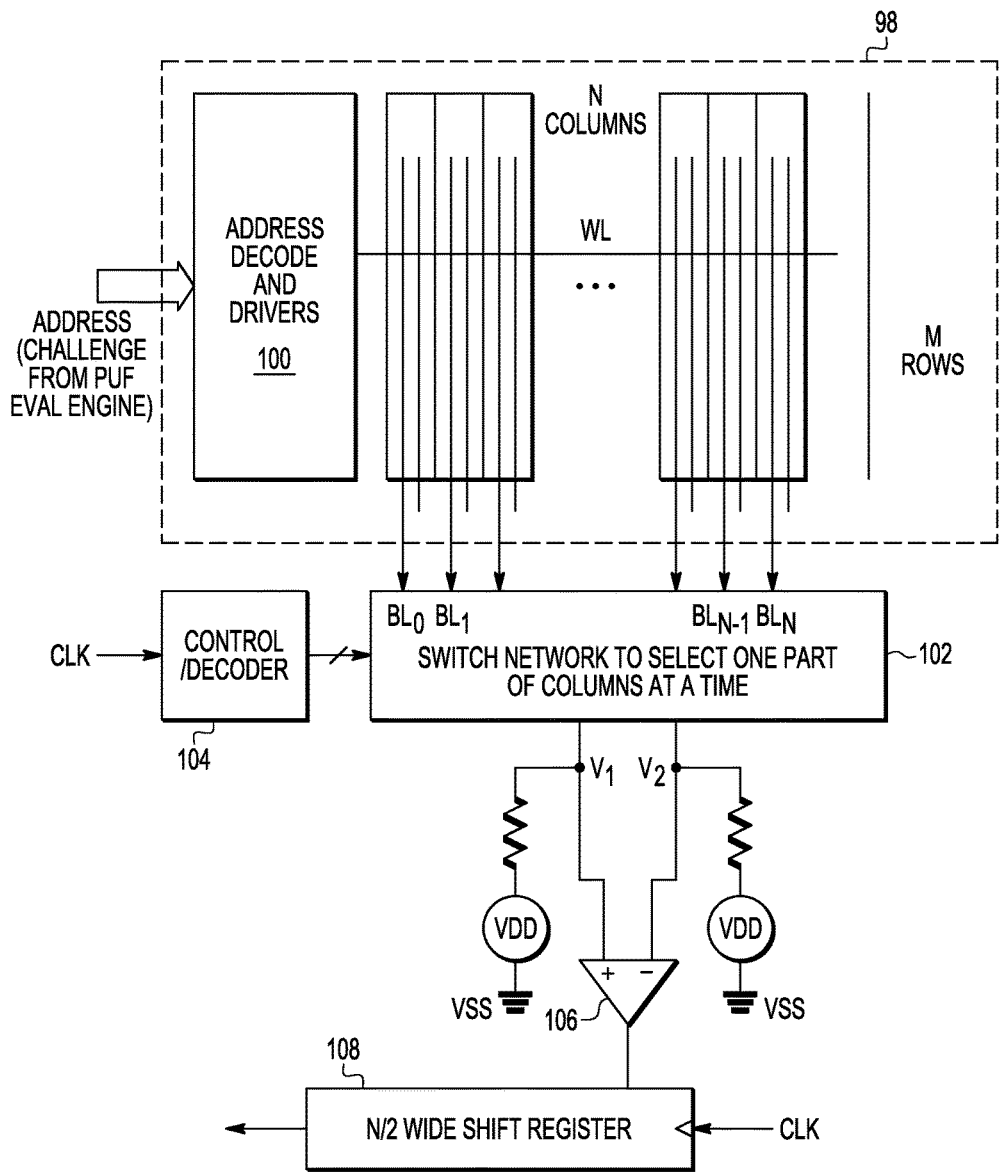
FIG. 7 illustrates a portion of the system of FIG. 1 for outputting a PUF response in accordance with another embodiment.

FIG. 7 illustrates a portion of the data processing system of FIG. 1 for outputting a PUF response in accordance with another embodiment. A portion 98 of SRAM array 18 includes N columns and M rows. The true bit lines of each of the N columns is provided to a switching network 102. Switching network 102 allows the N columns needed to produce a PUF response having N/2 bits to share the same comparator, such as comparator 106. The output of comparator 106 is connected to an input of an N/2-bit shift register. When an address is provided at the input of address decoder and WL drivers 100, the SRAM cells used to generate the PUF response are selected. Control and decoder 104 controls switch network 102 to sequence through the selected columns of SRAM array portion 98 to provide their output voltages for comparison by comparator 106. Control and decoder 104 may be implemented using a counter that will count the number of bits in the PUF response (N/2). Using only one comparator is more area efficient than using N/2 comparators as in FIG. 6, but the PUF response is generated more slowly.

Figure 8:
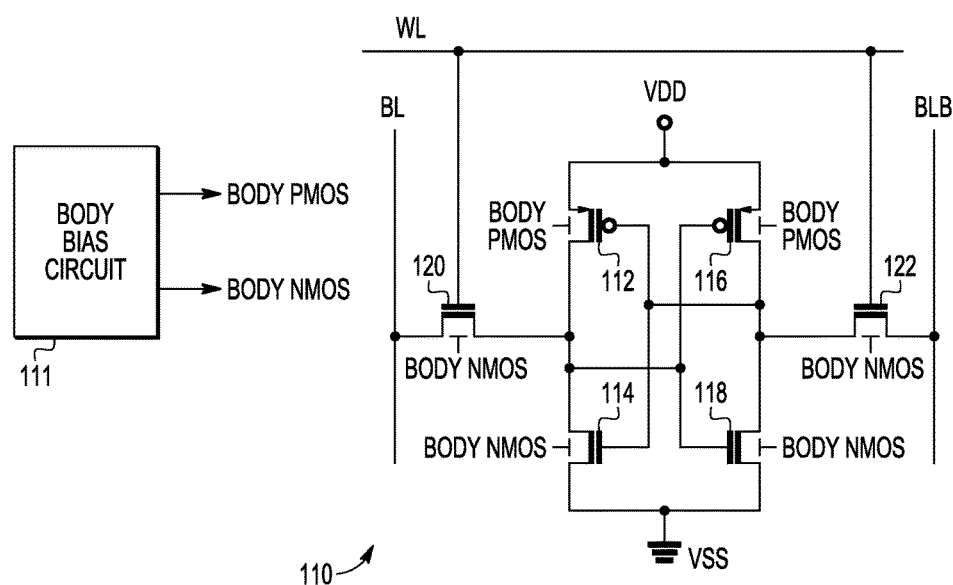
FIG. 8 illustrates another embodiment of an SRAM cell in accordance with an embodiment.

FIG. 8 illustrates an SRAM cell 110 and body bias circuit 111 for use in another embodiment. SRAM cell 110 is a six transistor SRAM cell and includes P-channel transistors 112 and 116, and N-channel transistors 114, 118, 120, and 122. N-channel transistor 114 and P-channel transistor 112 form a first inverter, and N-channel transistor 118 and P-channel transistor 116 for a second inverter. The two inverters are cross-coupled. N-channel transistors 120 and 122 are access transistors. Each of the transistors has a body terminal. A body terminal of P-channel transistors 112 and 116 is labeled BODY PMOS and a body terminal of N-channel transistors 114, 118, 120, and 122 is labeled BODY NMOS. A body bias voltage, commonly referred to as a back bias, may be provided to each of the body terminals for adjusting the transistor threshold voltage VT. Body bias circuit 111 generates body bias voltages labeled BODY PMOS and BODY NMOS for being selectively provided to the body terminals with the same name. Adjusting the body bias can increase VT resulting in a decrease in the difference between a gate-to-source voltage VGS and VT. The decreased difference in VGS−VT can increase randomness and reduce the size of the signature. In the illustrated embodiment, it is only necessary or desirable to adjust the body bias to the N-channel transistors because only the current through the N-channel transistors is being compared. However, in another embodiment, where different currents are being compared, then it may be desirable to adjust the threshold voltages of other cell transistors. A body bias condition that operates the transistors near or below the threshold voltage will be effective in achieving this increased relative variation of read currents.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for generating a digital code in a data processing system, the method comprising:
   selecting a plurality of static random access memory (SRAM) cells for a write operation;
   writing a predetermined logic state to all the plurality of SRAM cells;
   biasing only one bit line of each bit line pair of a plurality of bit line pairs corresponding to the plurality of SRAM cells to a predetermined voltage;
   coupling a bit line of a first SRAM cell of the plurality of SRAM cells to a first input of a comparator;
   coupling a bit line of a second SRAM cell of the plurality of SRAM cells to a second input of the comparator;
   generating a current on the bit lines of the first and second SRAM cells;
   converting the currents on both the bit lines to voltages;
   using the comparator, comparing the voltage on the bit line of the first SRAM cell to the voltage on the bit line of the second SRAM cell; and
   outputting a logic bit from the comparator, a logic state of the logic bit determined in response to the comparison.

2. The method of claim 1, wherein the plurality of SRAM cells comprises a physically unclonable function (PUF) and the digital code is a PUF response.

3. The method of claim 1, further comprising:
   saving the logic state of the logic bit in a parallel-in serial-out shift register; and
   generating the digital code using the logic state.

4. The method of claim 1, further comprising receiving a challenge from a security module, wherein the outputting the logic bit occurs in response to the challenge.

5. The method of claim 1, wherein the first and second SRAM cells are coupled to matched bit lines based on symmetrical bit line locations in a layout of bit line pairs of the plurality of bit line pairs.

6. The method of claim 1, wherein writing a predetermined logic state to all the plurality of SRAM cells further comprising writing a logic zero to all the plurality of SRAM cells.

7. The method of claim 1, further comprising selectively adjusting a body bias to at least one of transistor of the plurality of SRAM cells to change a threshold voltage of the at least one of transistor.

8. The method of claim 1, further comprising deactivating input/output circuitry in the data processing system prior to the step of generating a current of the bit lines.

9. The method of claim 1, generating the current on the bit lines further comprises generating the current through an N-channel transistor of each of the first and second SRAM cells.

10. A method for generating a digital code from a physically unclonable function (PUF) in a data processing system, the method comprising:
providing a plurality of SRAM cells to serve as the PUF;
selecting the plurality of static random access memory (SRAM) cells for a write operation in response to a challenge;
writing a predetermined logic state to all the plurality of SRAM cells;
biasing one bit line of each bit line pair of a plurality of bit line pairs corresponding to the plurality of SRAM cells to a predetermined voltage;
selecting the plurality of SRAM cells for a PUF read operation;
providing a first read current of one bit line of a first SRAM cell and a second read current of one bit line of a second SRAM;
converting the first read current to a first voltage and the second read current to a second voltage;
comparing the first voltage to the second voltage; and
outputting a logic bit in response to the comparison.

11. The method of claim 10, wherein writing the predetermined logic state further comprises writing a logic zero to all the plurality of SRAM cells.

12. The method of claim 10, further comprising providing the logic bit to a parallel-in serial-out shift register.

13. The method of claim 10, wherein providing a first read current of one bit line of a first SRAM cell and a second read current of one bit line of a second SRAM further comprises providing the first and second read currents through an N-channel transistor of each of the first and second SRAM cells.

14. The method of claim 10, further comprising selectively adjusting a body bias to at least one of transistor of the plurality of SRAM cells to change a threshold voltage of the at least one of transistor.

15. The method of claim 10, further comprising deactivating input/output circuitry in the data processing system prior to the step of providing the first and second read currents.

16. A data processing system comprising:
a processor core;
an SRAM array coupled to the processor core, the SRAM array having a plurality of SRAM cells, each SRAM cell of the plurality of SRAM cells coupled to a pair of bit lines and to a word line, wherein the plurality of SRAM cells for providing a physically unclonable function (PUF); and
a PUF evaluation engine coupled to the plurality of SRAM cells, the PUF evaluation engine comprising:
a selection circuit for selecting one or more word lines coupled to the plurality of SRAM cells in response to a challenge;
a bias circuit coupled to one bit line of each of the pairs of bit lines corresponding to the plurality of SRAM cells; and
at least one comparator coupled to the one bit line of each of the pairs of bit lines, the at least one comparator for comparing voltage differences between two of the bit lines, a voltage on a bit line representing a read current of one SRAM cell, wherein a logic state is output from the comparator in response to the comparison.

17. The data processing system of claim 16, further comprising a switching circuit for selecting coupling one bit line of a first bit line pair and one bit line of a second bit line pair to the at least one comparator.

18. The data processing system of claim 16, further comprising a body bias circuit for selectively adjusting a body bias to at least one of the transistors of the plurality of SRAM cells to change a threshold voltage of the at least one of the transistors.

19. The data processing system of claim 16, further comprising a parallel-in serial-out shift register coupled to an output of the at least one comparator.

20. The data processing system of claim 16, wherein the plurality of SRAM cells is coupled to a plurality of bit line pairs, wherein the at least one comparator further comprises a plurality of comparators, a comparator of the plurality of comparators coupled to a first bit line of a first bit line pair of the plurality of bit line pairs and to a first bit line of a second bit line pair of the plurality of bit line pairs.

* * * * *